(12) United States Patent
Hassan et al.

(10) Patent No.: US 10,132,998 B2
(45) Date of Patent: Nov. 20, 2018

(54) METHOD FOR MANUFACTURING A GERMANIUM SLOW LIGHT WAVEGUIDE AND PHOTODIODE INCORPORATING THIS SLOW LIGHT WAVEGUIDE

(71) Applicant: Commissariat a l'energie atomique et aux energies alternatives, Paris (FR)

(72) Inventors: Karim Hassan, Moneteau (FR); Daivid Fowler, Saint Martin le Vinoux (FR); Christophe Kopp, Fontanil-Cornillon (FR); Bertrand Szelag, Herbeys (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/660,183

(22) Filed: Jul. 26, 2017

(65) Prior Publication Data

US 2018/0031765 A1    Feb. 1, 2018

(30) Foreign Application Priority Data

Jul. 28, 2016   (FR) ...................... 16 57330

(51) Int. Cl.
*G02B 6/10*    (2006.01)
*G02B 6/26*    (2006.01)
(Continued)

(52) U.S. Cl.
CPC ............. *G02B 6/131* (2013.01); *G02B 6/122* (2013.01); *G02B 6/12004* (2013.01);
(Continued)

(58) Field of Classification Search
None
See application file for complete search history.

(56) References Cited

U.S. PATENT DOCUMENTS 6,252,287 B1 *  6/2001  Kurtz .................. H01L 31/0725
                                                136/252
8,217,382 B1 *  7/2012  Ptasinski .............. G02B 6/1225
                                                257/184

(Continued)

OTHER PUBLICATIONS

French Preliminary Search Report dated Apr. 13, 2017 in French Application 16 57330 filed on Jul. 28, 2016 (with English Translation of Categories of cited documents and Written Opinion).
Toshihiko Baba, "Slow Light Tuning in Photonic Crystals", SPIE—International Society for Optical Engineering. Proceedings, vol. 8808, 2013, 11 pages.

(Continued)

*Primary Examiner* — Eric Wong
(74) *Attorney, Agent, or Firm* — Oblon, McClelland, Maier & Neustadt, L.L.P.

(57) ABSTRACT

This method for manufacturing a germanium slow light waveguide includes:
producing, in a silicon plate, a cavity the cross section of which, parallel to the plane of the plate, is identical to the horizontal cross section of the slow light waveguide and the bottom of which is located inside the silicon plate; then
carrying out an operation of vapor phase epitaxial growth of germanium on the bottom of the cavity until this cavity is completely filled with germanium; and
before implementing said epitaxial growth operation, a protective layer is deposited on an upper face of the silicon plate or, after implementing said epitaxial growth operation, the germanium that has grown on said upper face is removed.

8 Claims, 3 Drawing Sheets

(51) Int. Cl.
  *G02B 6/13*    (2006.01)
  *G02B 6/12*    (2006.01)
  *G02B 6/122*   (2006.01)
  *H01L 31/0232* (2014.01)
  *H01L 31/105*  (2006.01)
  *H02S 40/44*   (2014.01)

(52) U.S. Cl.
  CPC ...... *H01L 31/02327* (2013.01); *H01L 31/105* (2013.01); *H02S 40/44* (2014.12); *G02B 2006/12123* (2013.01); *G02B 2006/12178* (2013.01)

(56) References Cited

U.S. PATENT DOCUMENTS

| | | | |
|---|---|---|---|
| 8,598,567 B2 * | 12/2013 | Huang | H01L 31/02327 257/21 |
| 9,035,409 B2 | 5/2015 | Na | |
| 2005/0265660 A1 | 12/2005 | Miller | |
| 2007/0104441 A1 | 5/2007 | Ahn et al. | |
| 2015/0293302 A1 | 10/2015 | Czornomaz et al. | |

OTHER PUBLICATIONS

Laurent Vivien, et al. "42 GHz p.i.n. Germanium photodetector integrated in a silicon-on-insulator waveguide", Optics Express; Optical Society of America, vol. 17, No. 8, 2009, 6 pages.

Jurgen Michel, et al. "High-performance Ge—on—Si photodetectors", Nature Photonics, vol. 4, 2010, 8 pages.

Ryan Going, et al. "Germanium wrap-around photodetectors on Silicon photonics", Optics Express; Optical Society of America, vol. 23, No. 9, 2015, 10 pages.

J. G. Fiorenza, et al. "Aspect Ratio Trapping: a Unique Technology for Integrating Ge and III-Vs with Silicon CMOS", ECS Transactions; The Electrochemical Society, vol. 33, No. 6, 2010, 14 pages.

V. Destefanis, et al. "Selective epitaxial growth of Ge(1 1 0) in trenches using the aspect ratio trapping technique", Journal of Crystal Growth, vol. 312, 2010, 8 pages.

Gilles Denoyer, et al. "Hybrid Silicon Photonic Circuits and Transceiver for 50 Gb/s NRZ Transmission Over Single-Mode Fiber", Journal of Lightwave Technology, vol. 33, No. 6, 2015, 8 pages.

Joost Brouckaert, et al. "Thin-Film III-V Photodetectors Integrated on Silicon-on-Insulator Photonic ICs", Journal of Lightwave Technology, vol. 25, No. 4, 2007, 8 pages.

* cited by examiner

METHOD FOR MANUFACTURING A GERMANIUM SLOW LIGHT WAVEGUIDE AND PHOTODIODE INCORPORATING THIS SLOW LIGHT WAVEGUIDE

The invention relates to a method for manufacturing a germanium slow light waveguide on a silicon plate. The invention also relates to a method for manufacturing a photodiode implementing this method for manufacturing a slow light waveguide and a photodiode manufactured using this method.

U.S. Pat. No. 9,035,409B2 describes a photodiode including a slow light waveguide. Additionally, U.S. Pat. No. 9,035,409B2 describes a method for manufacturing the germanium slow light waveguide on a silicon plate extending mainly in a plane referred to as the "plane of the plate". This slow light waveguide includes a horizontal cross section, parallel to the plane of the plate, that exhibits the same pattern repeated at regular intervals along an optical axis, these patterns being positioned symmetrically on either side of the optical axis in such a way that this arrangement of patterns slows the propagation of the optical signal along the optical axis inside the slow light waveguide.

In the other embodiments of U.S. Pat. No. 9,035,409B2, the patterns of the slow light waveguide are holes passing all the way through a germanium central strip or notches made in lateral flanks of this central strip.

In order to manufacture such a slow light waveguide and such a photodiode, U.S. Pat. No. 9,035,409B2 teaches that the patterns of the slow light waveguide are directly etched into the germanium.

One particular advantage of incorporating such a slow light waveguide into a photodiode is a substantial increase in the coefficient of absorption of the photodiode, i.e. the amount of light absorbed per unit length. This coefficient is typically expressed in dB/μm.

However, it has been observed that the germanium into which the patterns have been etched exhibits numerous defects, such that the efficiency of the photodiode of U.S. Pat. No. 9,035,409B2 could be further improved if it were possible to manufacture such a slow light waveguide in germanium with fewer defects. The efficiency of a photodiode is the ratio of the strength of the current generated by the photodiode when an optical signal is detected to the strength of the optical signal received on the input of this photodiode.

Prior art is also known from:
US2015/293302A1,
Thoshihiko Baba: "Slow light tuning in photonic crystals", SPIE INTERNATIONAL SOCIETY FOR OPTICAL ENGINEERING, Proceedings, Vol. 8808, page 88081A, Nov. 9, 2013,
US2007/104441A1.

The invention therefore aims to propose a method for manufacturing a germanium slow light waveguide on a silicon plate which makes it possible to obtain a slow light waveguide exhibiting fewer defects than that obtained using the method described in U.S. Pat. No. 9,035,409B2. One subject thereof is therefore such a method in accordance with claim 1.

The inventors have observed that a substantial portion of the defects of the slow light waveguide manufactured according to the method of U.S. Pat. No. 9,035,409B2 are due to the operation of etching the patterns into the germanium.

The aforementioned method for manufacturing the slow light waveguide allows the patterns of the slow light waveguide to be structured without it being necessary to have recourse to an operation of etching the germanium to achieve this. A germanium slow light waveguide is thus obtained which exhibits patterns capable of slowing the propagation of the optical signal while exhibiting few defects.

Another subject of the invention is a method for manufacturing a photodiode in accordance with claim 2.

When a photodiode is manufactured by implementing the method claimed, the germanium slow light waveguide of this photodiode exhibits fewer defects in the zone of maximum absorption than if it had undergone an etching operation. Consequently, the efficiency of the photodiode manufactured by the method claimed is higher.

Another subject of the invention is a photodiode manufactured by the manufacturing method claimed.

Embodiments of the photodiode may exhibit one or more of the features of the dependent claims.

Embodiments of the photodiode may exhibit one or more of the following advantages:

By providing the photodiode with two inputs, it is possible to use it to detect two different optical signals. This therefore allows the number of photodiodes required to perform this task to be halved. Moreover, by virtue of the presence of the slow light waveguide interposed between these two inputs, the crosstalk between these inputs is greatly decreased, thereby making it practical to use such a photodiode having two inputs.

Using teeth the length of which is greater than the width of the central strip of the slow light waveguide allows the absorption coefficient of the guided optical signal to be improved. Specifically, this conformation leaves the central strip unchanged such that the entirety of the volume of the central strip is used for collecting photons. By contrast, in the embodiments of U.S. Pat. No. 9,035,409B2, the patterns decrease the volume of the central strip. Increasing this absorption coefficient allows, for the same level of performance, shorter photodiodes to be designed.

Using teeth that are at least twice longer than the width of the central strip additionally allows the spectral width of the band gap to be increased. The band gap is defined here as the band of wavelengths within which the attenuation of the optical signal exceeds −27 dB.

Because the doped edges of the cavity are in direct mechanical and electrical contact with the doped flanks of the slow light waveguide, the intensity of the dark current in the photodiode is decreased.

Because the output of the first waveguide is in direct contact with the input of the slow light waveguide, losses due to optical coupling between the output of this first waveguide and the input of the slow light waveguide are limited.

Because the thickness of the slow light waveguide is equal to the depth of the cavity in which it is accommodated, it is possible to manufacture a highly planar, and hence compact, photodiode which is compatible with the electrical interconnections commonly used in electronics.

The invention will be better understood on reading the following description, given merely by way of non-limiting example and with reference to the drawings in which.

In these figures, the same references are used to denote the same elements. Hereinafter in this description, the features and functions that are well known to those skilled in the art are not described in detail.

Figure 1:
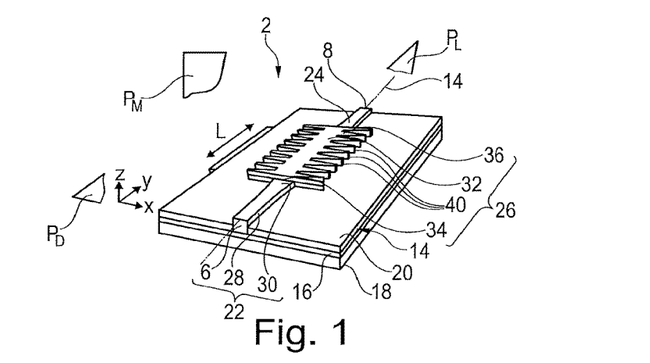
FIG. 1 is a schematic illustration, in perspective, of a photodiode.
Figure 4:
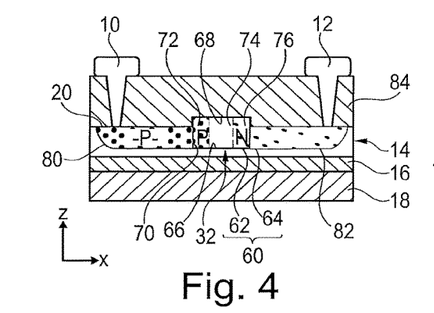
FIGS. 4 and 5 are schematic illustrations, in cross section at two different points, of the slow light waveguide of the photodiode of FIG. 1.
Figure 5:
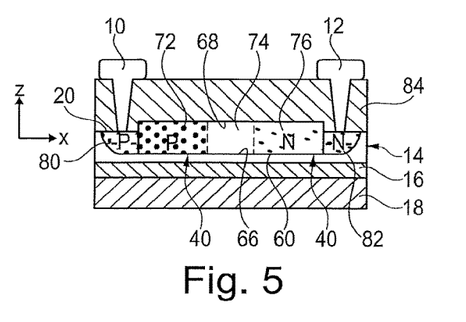

FIG. 1 shows a photodiode 2 with two inputs 6 and 8. The photodiode 2 is capable of detecting an optical signal which is input, alternately, via input 6 and input 8. More specifically, the photodiode 2 converts the optical signal to an electrical signal generated between two contact lands 10 and 12 (FIGS. 4 and 5). Typically, the wavelength λ of the optical signal to be detected is between 1260 nm and 1625 nm, and preferably between 1260 nm and 1360 nm (O band) or between 1530 nm and 1565 nm (C band). Here, the wavelength λ is equal to 1310 nm.

The photodiode 2 includes a silicon plate 14 which extends in a horizontal plane $P_D$ referred to as the "plane of the plate". In this application, the figures are oriented with respect to an orthogonal coordinate system XYZ. The X and Y directions are horizontal and the Y direction is parallel to an optical axis 14 along which the optical signal propagates within the photodiode 2. The Z direction is vertical. In this text, terms such as "upper", "lower", "above" and "below" are defined with respect to the Z direction.

Here, the expressions "elements produced in material M", "elements made of material M" or "M elements" signify that more than 95% and, preferably, more than 97% or 99% of this element by mass is formed by the material M.

In this embodiment, the plate 14 is formed by the monocrystalline silicon layer of an SOI (silicon-on-insulator) substrate. Consequently, it extends directly over a dielectric layer 16 which is itself directly deposited on a substrate 18.

The thickness $e_{14}$ of the plate 14 is typically higher than 50 nm or 100 nm and typically lower than 1 μm. Here, the thickness $e_{14}$ is equal to 300 nm.

The plate 14 has a horizontal upper face 20 on the side opposite the substrate 18.

The layer 16 is made of a material the refractive index of which is strictly lower than that of silicon. For example, the layer 16 is made of silicon oxide ($SiO_2$) or silicon nitride. The substrate 18 is for example made of silicon. Its thickness is typically higher than 140 μm, 500 μm or 725 μm.

The photodiode 2 includes two waveguides 22 and 24, as well as a germanium slow light waveguide 26, formed on the upper face 20. In this embodiment, the photodiode 2 is symmetrical with respect to a vertical longitudinal plane $P_L$ containing the optical axis 14 and with respect to a vertical medial plane $P_M$ perpendicular to the axis 14. The guides 22 and 24 are each positioned on a respective side of the medial plane $P_M$ and only the guide 22 is described in greater detail.

The guide 22 includes a rectilinear strip 28 which extends along the axis 14 from the input 6 up to an output 30. The strip 28 is shaped so as to guide the optical signal received on the input 6 to the output 30. Here, it is shaped so as to guide a single mode of the optical signal such that the waveguide 22 is a single-mode waveguide. For example, the cross section of the strip 28 is rectangular. In this embodiment, the strip 28 is made of monocrystalline silicon. It forms a single block of material with the plate 14.

Here, the thickness $e_{28}$ of the strip 28 is constant. Generally, the thickness $e_{28}$ is lower than or equal to the thickness $e_{14}$ of the plate 14. For example, the thickness $e_{28}$ is higher than or equal to 50 nm or 100 nm and, preferably, lower than 250 nm or 500 nm. Here, the thickness $e_{28}$ is equal to 150 nm.

In this embodiment, within a transition zone 22E (FIG. 2), the cross section of the strip 28 widens, in the X direction, as it approaches the output 30. Thus, the cross section of the output 30 is wider than the cross section of the input 6. Such a transition zone improves the optical coupling between the guides 22 and 26.

Hereinafter, when referring to the "width" of the guide 22, the width of the strip 28 measured in the X direction is meant. More specifically, "width of the guide 22" refers to the shortest distance, measured in the X direction, between vertical lateral flanks of the strip 28. This width is between 200 nm and 3 μm. Here, this width is denoted by W6 at the input 6 and W30 at the input 30. Here, W6 is equal to 0.4 μm and W30 is equal to 0.6 μm. The length of the guide 22, in the Y direction, is greater than λ.

The guide 26 includes patterns repeated regularly in the Y direction. These patterns are arranged so as to form a photonic crystal capable of slowing the propagation of the optical signal of wavelength λ propagating along the axis 14. In this embodiment, the patterns are teeth 40 distributed at regular intervals on the vertical lateral flanks of a central strip 32 of the guide 26. The teeth 40 and the strip 32 are described in greater detail with reference to FIGS. 2 to 5.

Figure 2:
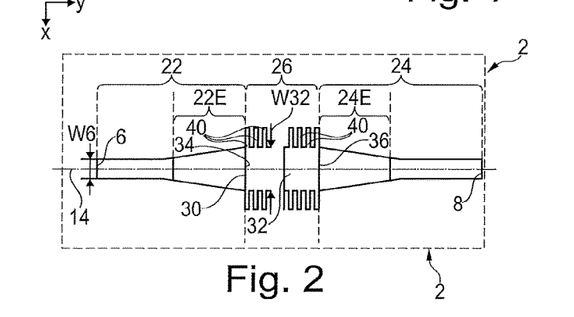
FIG. 2 is a partial schematic illustration, from above, of the photodiode of FIG. 1.

The strip 32 is rectilinear and extends along the axis 14 between two inputs 34 and 36 each positioned on an opposite side. In this embodiment, the inputs 34 and 36 are merged with the output 30 and the output of the guide 24, respectively.

Here, the cross section of the strip 32 is rectangular. Its width, denoted by W32, is typically between 200 nm and 3 μm. Here, the width W32 is equal to the width of the cross section of the output 30.

The width W32 is defined solely between two immediately consecutive teeth 40. Between two immediately consecutive teeth 40, the width W32 is taken to be equal to the shortest distance, measured in the X direction, between the vertical lateral flanks facing the strip 32 which are located on each side of the axis 14. Here, this width W32 is constant.

In this embodiment, the strip 32, like the teeth 40, are produced in one and the same single block of germanium.

FIG. 2 shows the photodiode 2 in greater detail. In this figure, the dashed lines indicate that a central portion of the guide 26 has not been shown in order to simplify the illustration.

The transition zones 22E and 24E of the guides 22 and 24 are shown in this FIG. 2.

The guide 26 extends along the axis 14 over a length $L_{26}$ that is greater than $d_{min}$ and, preferably, greater than $2\,d_{min}$ or $5\,d_{min}$. $d_{min}$ is defined by the following relationship: $d_{min} = \mathrm{Max}[\lambda;\ 5p]$, where:

Max[ . . . ] is the function that returns the highest of the values listed between the square brackets;

λ is the wavelength of the optical signal; and p is the interval between the teeth 40 and will be described below.

Typically, $L_{26}$ is greater than 1 µm, 10 µm or 15 µm and, generally, smaller than 1 mm or 6 mm. In the majority of cases, the width $L_{26}$ is between 1 µm and 50 µm. Here, the length $L_{26}$ is equal to 15 µm.

The lateral teeth 40 are positioned periodically in the Y direction so as to slow the propagation of the optical signal in this direction. In order to simplify FIG. 2, the reference 40 has only been provided for a few of the teeth shown in this figure. An enlargement of such a tooth 40 can also be seen in FIG. 3.

Each tooth 40 extends along a direction 41 (FIG. 3) of extension from a proximal end 42 up to a distal end 44. Typically, the direction 41 is centred on the tooth 40 and passes through the geometrical centre of this tooth 40. The geometrical centre of a tooth is the barycentre of all of the points belonging to this tooth when assigning the same weight to each of these points. The directions 41 of the teeth 40 located on one and the same side of the axis 14 are parallel to one another. Here, the direction 41 is substantially parallel to the X direction. Thus, in this embodiment, the angle α between the direction 41 and the axis 14 is equal to 90°, give or take 3°, or give or take 5°. The proximal end 42 is anchored in the lateral flanks of the strip 32. Thus, the lateral flank of the strip 32 located between two consecutive teeth 40 links the proximal ends 42 of these two teeth. To achieve this, it extends from one proximal end 42 up to the next in the Y direction.

Figure 3:
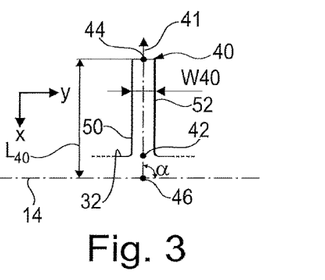
FIG. 3 is a schematic illustration, from above, of a tooth of a slow light waveguide of the photodiode of FIG. 1.

Each tooth 40 forms a single block of material with the strip 32.

Each tooth 40 includes a respective point 46 of intersection between its direction of extension 41 and the axis 14.

The tooth 40 includes two vertical lateral flanks 50, 52 which each extend from the proximal end 42 up to the distal end 44. Here, these flanks 50 and 52 are flat and both are parallel to the X direction. In this embodiment, the distal end 44 is also planar. It is formed by a vertical plane parallel to the Y direction. Thus, in this embodiment, the horizontal cross section of the tooth 40 is rectangular.

The width W40 of the teeth 40 in the Y direction is constant. For example, the width W40 is between p/5 and p/(1.2) and, preferably, equal to p/2. Here, the aspect ratio of the teeth 40 is lower than 10 and, preferably, lower than 3.5. Preferably, the aspect ratio of the teeth 40 is between 1.1 and 3.1. The aspect ratio of the tooth 40 is equal to the ratio of the length to the width of the smallest horizontal rectangle entirely containing the tooth 40 and its point 46 of intersection. Here, the aspect ratio is equal to $L_{40}$/W40, where $L_{40}$ is the length of the tooth 40. The length $L_{40}$ is the shortest distance, in the X direction, between the axis 14 and the distal end 44 of this tooth.

The teeth 40 are positioned at regular intervals p in the Y direction on either side of the axis 14. The interval p is equal to the distance separating two immediately consecutive points 46 of intersection along the axis 14. The interval p is smaller than $\lambda/n_{eff}$ and, preferably, equal to $\lambda/(2n_{eff})$, where $n_{eff}$ is the effective propagation index of the optical mode propagating through the guide 26. The index $n_{eff}$ is also known as the "mode phase constant". It is defined by the following relationship: $n_g = n_{eff} - \lambda dn_{eff}/d\lambda$, where $n_g$ is the group index.

The interval p is generally greater than 50 nm. In the majority of cases, the interval p is between 100 nm and 2 µm. Here, for digital applications, the interval p is taken to be equal to 170 nm.

The filling factor of the guide 26 is defined as being equal to the ratio S1/S2 where:

S1 is the surface area of the orthogonal projection of the guide 26 onto a horizontal plane, i.e. the surface area of the orthogonal projection of the parts of the guide 26 that are made of germanium; and S2 is the surface area of the orthogonal projection of the smallest convex envelope that entirely contains the orthogonal projection of the guide 26 on this same horizontal plane.

Thus, the lower the filling factor, the smaller the surface area of germanium inside the guide 26. Typically, the filling factor is between 0.25 and 0.75, or between 0.45 and 0.55. Here, the filling factor is chosen to be equal to 0.5.

FIG. 4 shows a vertical cross section, parallel to the plane XZ, which cuts through the guide 26 between two teeth 40. Thus, in this figure, only the strip 32 of the guide 26 is visible. The guide 26 is housed within a cavity 60 hollowed out of the plate 14. The cavity 60 includes a horizontal bottom 62 and vertical edges 64 formed within the plate 14.

In practice, due to imperfections in the method for manufacturing the photodiode 2, the vertical edges and the vertical flanks are not perfectly vertical. For example, the angle between the vertical edges or flanks and the horizontal is between 80° and 100°. In the figures, these imperfections have not been shown.

The depth $P_{60}$ of the cavity 60 is strictly lower than the thickness $e_{14}$ of the plate 14. For example, the difference between the thickness $e_{14}$ and the depth $P_{60}$ is greater than or equal to 20 nm or 30 nm such that a thin layer of silicon remains below the cavity 60. Here, the difference between the thickness $e_{14}$ and the depth $P_{60}$ is equal to 50 nm. For numerical simulations, the depth $P_{60}$ is chosen to be equal to 250 nm.

The horizontal cross section of the cavity 60 is identical to the horizontal cross section of the guide 26 described with reference to FIGS. 2 and 3. It is recalled here that the "horizontal cross-section" of the guide 26 solely comprises the locations of the guide 26 that are made of germanium. Thus, any void formed inside the guide 26 does not form part of the horizontal cross section of the guide 26, even if this void is filled with a material other than germanium. For example, as described below with reference to FIG. 17, such a void may be a vertical cylindrical hole passing all the way through the germanium waveguide and filled with silicon in order to form a silicon pad in the middle of the germanium guide.

The guide 26 extends vertically from a lower horizontal face 66 up to an upper face 68 on the opposite side. The faces 66 and 68 are connected to one another by vertical lateral flanks 70 of the guide 26. The face 66 is planar and bears directly on the bottom 62 of the cavity 60.

The thickness $e_{26}$ of the guide 26 corresponds to the shortest distance between the faces 66 and 68. Here, the thickness $e_{26}$, at all points of the guide 26, is strictly higher than the depth $P_{60}$ such that the face 68 is located above the face 20 of the plate 14. For example, the thickness $e_{26}$ is such that the following relationship is satisfied: $e_{26} \geq P_{60} + e_{22}$. Generally, the thickness $e_{26}$ is lower than $2P_{60}$. Preferably, the thickness $e_{26}$ is equal to $P_{60}$ $e_{22}$, give or take 10 nm, or give or take 20 nm.

The lower part of the vertical flanks 70 bears directly on the vertical edges 64 facing the cavity 60. The upper part of the vertical flanks 70 protrudes beyond the face 20 of the plate 14.

In order to obtain a current from the electrical charges generated by the optical signal when it interacts with the germanium, the guide 26 is arranged so as to form a PiN (positive-intrinsic-negative) diode. To achieve this, in the X direction, the guide 26 includes three differently doped contiguous regions, namely:
- a p-doped region 72;
- an intrinsic region 74; and
- an n-doped region 76.

Here, the region 74 extends along the axis 14 and the regions 72 and 76 are located on either side of the longitudinal plane $P_L$. The regions 72 and 76 each include respective vertical flanks 70.

In order for a current to be able to flow through the photodiode 2, the region 72 is electrically connected to the land 10 by way of a p-doped region 80 formed inside the plate 14. More specifically, the region 80 extends from the vertical edge 64 of the cavity 60, in direct contact with the vertical flank 70 of the region 72, up to a lower end of the land 10. The region 76 is electrically connected to the land 12 by way of an n-doped region 82 formed in the plate 14. The region 82 extends from a vertical edge 64 of the cavity 60, in direct contact with a vertical flank 70 of the region 76, up to the lower end of the land 12.

The upper part of the guide 26 which protrudes above the face 20 of the plate 4 is encapsulated in a dielectric material 84. The material 84 has a refractive index that is lower than that of silicon and germanium. Typically, the material 84 is $SiO_2$ or SiN. The lands 10 and 12 pass vertically through this material 84 in order to reach the regions 80 and 82, respectively.

FIG. 5 shows, in vertical cross section, parallel to the plane XZ, the guide 26 at a pair of teeth 40.

Figure 6:
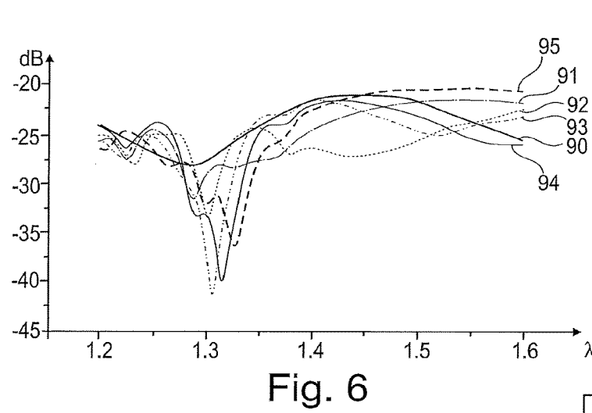
FIG. 6 is a graph showing the transmission coefficient of the photodiode of FIG. 1 as a function of the wavelength of the optical signal and for various lengths of the teeth of FIG. 3.

FIG. 6 shows the variation in the transmission coefficient $T(\lambda)$, expressed in decibels (dB), of the photodiode 2 as a function of the wavelength $\lambda$ of the optical signal which passes therethrough in a direction going from the input 6 towards the input 8. The coefficient $T(\lambda)$ is equal to the ratio:
- of the power of the optical signal at the input 8 to
- the power of the optical signal at the input 6.

The curves 90 to 95 have been obtained by numerical simulation and, more specifically, by means of the 3D FDTD (three-dimensional finite-difference time-domain) method.

The curves 91 to 95 have been obtained by simulating the photodiode 2 for various lengths $L_{40}$ of the teeth 40 between 0.45 µm and 1.24 µm. The curve 90 is a reference curve corresponding to the case in which the guide 26 is without teeth ($L_{40}$=W32/2). It is recalled here that the width W32 of the strip 32 is 0.6 µm such that the length $L_{40}$, as defined above, is necessarily greater than 0.3 µm so that the tooth 40 protrudes beyond the vertical flanks 70 of the strip 32.

Here, the curves 90 to 95 correspond to the following lengths $L_{40}$, respectively: 0.45 µm; 0.6 µm; 0.77 µm; 0.92 µm; 1.08 µm and 1.24 µm.

This graph shows that even for a short length $L_{40}$, the coefficient $T(\lambda)$ exhibits a minimum of less than 25 dB for a wavelength $\lambda$ of around 1.3 µm. Consequently, even in this case, the majority of the input optical signal is absorbed by the guide 26. The photodiode 2 therefore has an absorption coefficient of more than 1.5 dB/µm.

Moreover, this graph also shows that the length $L_{40}$ may be adjusted experimentally or by numerical simulation in order to reach even lower transmission coefficients $T(\lambda)$. For example, here, for a length $L_{40}$ equal to 0.92 µm (curve 93), it is possible to obtain a coefficient $T(\lambda)$ of less than 40 dB and hence an even higher absorption coefficient. Lastly, it is also possible to adapt the length $L_{40}$ in order to widen the band gap of the guide 26. For example, here, a length $L_{40}$ equal to 1.24 µm (curve 95) allows a much wider band gap to be obtained than with a length $L_{40}$ equal to 0.92 µm.

Figure 7:
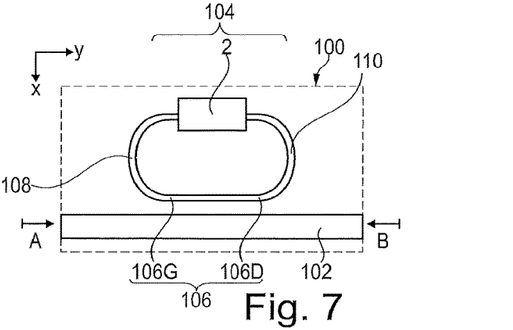
FIG. 7 is a schematic illustration of a device incorporating the photodiode of FIG. 1.

FIG. 7 shows a device 100 incorporating the photodiode 2 in order to detect an optical signal flowing through a waveguide 102 in a direction A and, alternately, in an opposite direction B. In this embodiment, the device 100 includes a ring resonator 104 that is optically coupled to the guide 102, for example, by way of evanescent coupling. This ring resonator 104 includes:
- a portion 106 which extends in proximity to the guide 102 and which is optically coupled to this guide by way of evanescent coupling;
- the photodiode 2;
- a curved portion 108 which optically connects an end 106G of the portion 106 to the input 6 of the photodiode 2; and
- another curved portion 110 which optically connects an end 106D of the portion 106 to the input 8 of the photodiode 2.

When an optical signal propagates in the direction A, a fraction of this optical signal is transmitted to the ring resonator 104 by way of the evanescent coupling. This fraction of the optical signal then propagates within the portions 106 and 110 to the input 8. Next, this fraction of the optical signal is detected by the photodiode 2. As indicated above, this fraction of the optical signal is practically entirely absorbed by the guide 26 such that the power of this fraction of the optical signal returned to the input 6 is minuscule. Thus, this does not disrupt the optical signal flowing through the guide 102.

When the optical signal propagates through the guide 102 in the direction B, the operation of the device 100 is the same except that the fraction of the optical signal to be detected is received on the input 6 instead of on the input 8 of the photodiode 2. The same photodiode 2 therefore allows two different optical signals to be detected.

The manufacture of the photodiode 2 will now be described with the aid of the flowchart of FIG. 8 and with reference to FIGS. 9 to 15.

The method begins with a step 118 of providing an SOI substrate 124 (FIG. 9) corresponding to the stack of the substrate 18, of the layer 16 and of the plate 14.

Figure 9:
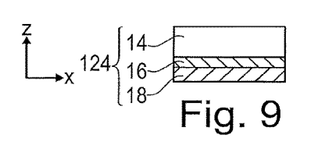
FIGS. 9 through 15 are schematic illustrations, in cross section, of various states in the manufacture of the photodiode of FIG. 1.
Figure 10:
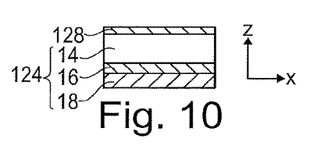
Figure 11:
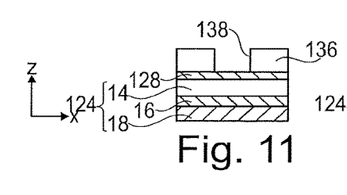

Next, in a step 120, the guides 22 and 24 are manufactured. The manufacture of a waveguide in the form of a rib, like the guides 22 and 24, is well known. Thus, this step is not described in detail. For example, the strips 28 of the guides 22, 24 are manufactured by etching and thinning the thickness of the plate 14.

In a step 126, a protective layer 128 (FIG. 10) is deposited on the upper face 20 of the plate 14. This layer 128 is made of a material on which germanium is not able to grow during an operation of vapour phase epitaxial growth of germanium. For example, the layer 128 is made of silicon dioxide. Its thickness is typically higher than or equal to 50 nm and generally lower than 1 µm.

Next, in a step 130, a cavity 132 (FIG. 12) having the same horizontal cross section as the guide 26 is hollowed out of the layer 128 at the location where the cavity 60 must be made. For example, the cavity 132 is produced by means of photolithography. To achieve this, in an operation 134, a layer 136 (FIG. 11) of photoresist is deposited on the upper face of the layer 128. Next, a void 138 (FIG. 11) which passes all the way through the thickness of the resist layer 136 is produced in order to expose the portion of the upper face of the layer 128 to be etched. The horizontal cross section of the void 138 is identical to the horizontal cross section of the guide 26.

Figure 12:
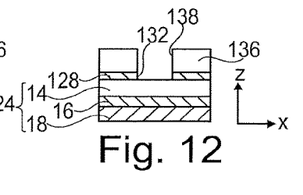

Next, in an operation 142, the layer 128 is etched through the void 138 in order to obtain the cavity 132.

In a step 144 (FIG. 13), the resist layer 136 is removed in order to expose the upper face of the layer 128 in which the cavity 132 has been formed.

In a step 148, the cavity 132 (FIG. 14) is extended, in the vertical direction, inside the plate 14 in order to form the cavity 60 in this plate 14. In this step 148, the layer 128 is therefore used as a mask, i.e. the plate 14 is etched through the cavity 132. The etching of the plate 14 is interrupted before reaching the layer 16 so that a thin layer of silicon of at least 30 nm in thickness remains between the bottom 62 of the cavity 60 and the layer 16.

In a step 150 (FIG. 15), the operation of vapour phase epitaxial growth of germanium on the bottom 62 of the cavity 60 is carried out until this cavity 60 is completely filled. Typically, this operation is carried out by implementing a method known by the acronym RP-CVD (reduced pressure chemical vapour deposition). To achieve this, a low thickness of germanium is first deposited at low temperature directly on the bottom 62. For example, by "low temperature", a temperature of less than 400° C. is meant. In this first phase, the temperature is also generally higher than 200° C. By "low thickness", a thickness of less than 50 nm and generally more than or equal to 30 nm is meant. Here, in the first phase, the thickness of germanium deposited on the bottom 62 is 40 nm.

Figures 13, 14, 15, 16, 17:
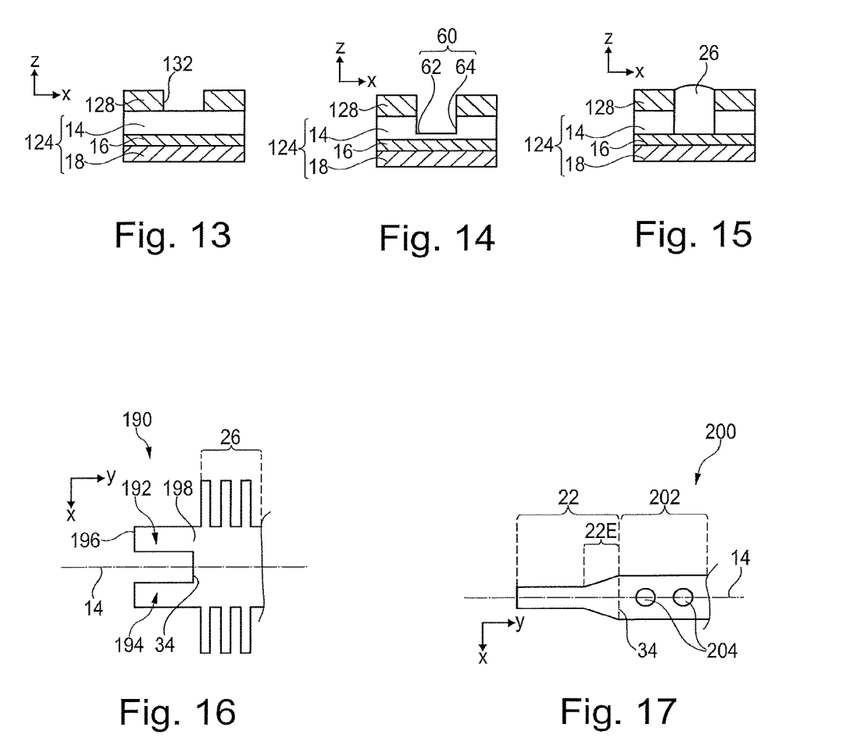
FIGS. 16 and 17 are partial schematic illustrations, from above, of third and fourth embodiments of a photodiode.

Next, a second phase of growing the germanium layer inside the cavity 60 is carried out at a higher temperature. Typically, in the second phase, the temperature is higher than 650° C. or 700° C. Here, it is 730° C. This second phase is used to deposit 410 nm of germanium within the cavity 60 and hence completely fill this cavity. At this stage, the thickness of germanium is equal to the desired thickness $e_{26}$.

Such a method is for example described in the following article: Vivien L. et al: "42 GHz p.i.n Germanium photodetector integrated in a silicon-on-insulator waveguide", Optics Express, Vol. 17, No. 8, 13 Apr. 2009, pages 6252-6257. This article will be referred to hereinafter as "Vivien2009". This method is therefore not described here in greater detail.

In step 150, the deposited thickness $e_{26}$ of germanium remains lower than the critical thickness beyond which the number of dislocation defects in the germanium becomes very large. Moreover, typically, the thickness $e_{26}$ is adjusted so that the upper face 68 of the guide 26 is, at all points, located at a height of less than 500 nm and, preferably, less than 200 nm or 100 nm above the horizontal plane containing the face 20 of the plate 14.

In step 150, the germanium grows solely inside the cavity 60 and not on the layer 128. Thus, at the same time as the germanium is deposited on the plate 14, the teeth 40 are formed, since the cross section of the cavity 60 is identical to that desired for the waveguide 26.

In a step 152, the layer 128 is removed and the germanium 26 and the plate 14 are locally doped in order to obtain the doped regions 72, 76, 80 and 82. This doping is necessary in order to recover the photocurrent.

In a step 154, the guide 26 is encapsulated in the layer 84.

FIG. 16 shows a left-hand part of a photodiode 190. The other parts of the photodiode 190 can be deduced by symmetry with respect to the medial plane $P_M$. The photodiode 190 is identical to the photodiode 2 except that the guide 22 is replaced by two waveguides 192 and 194. Here, the guide 194 is symmetrical to the guide 192 with respect to the longitudinal plane $P_L$. The guide 192 includes an input 196 and an output 198. The guide 192 is for example constructed in a similar or identical manner to that which has been described for the guide 22 except that it is without a transition zone. The output 198 is in direct contact with the input 34 of the guide 26.

In this embodiment, the photodiode 190 comprises several inputs connected to the same input 34 of the guide 26. This embodiment makes it possible to increase the number of inputs of the photodiode even further and hence to decrease the number of photodiodes used to detect optical signals propagating, alternately, through multiple different waveguides.

FIG. 17 shows a left-hand part of a photodiode 200. The other parts of the photodiode 200 can be deduced by symmetry with respect to the plane $P_M$.

The photodiode 200 is identical to the photodiode 2 except that the guide 26 is replaced by a slow light waveguide 202. The guide 202 is identical to the guide 26 except that the teeth 40 are replaced by pads 204. These pads originate from the plate 14 by way of protection before etching the cavity 60. The guide 200 is similar to that described with reference to FIG. 1 of U.S. Pat. No. 9,035,409B2 and only a few details are given here.

The pads 204 are repeated at regular intervals p along the axis 14. Each pad 204 is a vertical cylinder the cross section of which is, for example, circular. It extends from the bottom 62 of the cavity 60 up to the upper face 68 of the slow light waveguide. For example, the lower part of each pad which is located inside the cavity 60 is made of monocrystalline silicon. The lower part of each pad 204 forms a single block of material with the plate 14. The upper part of the pad 204 which protrudes above the face 20 is, for example, made of silicon oxide. With this choice of materials for the pad 204, the photodiode 200 is manufactured using the same method as that of the figure.

Slow Light Waveguide Variant:

That which has been described above also applies to the case in which the photodiode is a PN (positive-negative) diode. In this latter case, the intrinsic region 74 is omitted.

In another variant, at all points of the guide 26, the thickness $e_{26}$ is equal to the depth $P_{60}$. In this case, the upper face 68 of the guide 26 is flush with the upper face 20 of the plate 14.

A thin layer of silicon oxide of less than 5 nm in thickness may exist between the vertical edges of the cavity 60 and the vertical flanks 70 of the slow light waveguide.

In another embodiment, the doped regions 72, 76 are omitted. In this embodiment, doping is then solely carried out in the plate 14 and only the regions 80 and 82 are doped. Such doping may then also be carried out in the SOI substrate 124, before step 118, through localized ion implantation (boron/phosphorus for example). Consequently, step 152 may also be omitted.

The slow light waveguide is not necessarily symmetrical with respect to the medial plane $P_M$. For example, the transition zone 22E may be shorter or longer than the zone 24E.

As a variant, the angle between the direction 41 of extension of the teeth 40 and the axis 14 is other than 90°. For example, this angle is between 30° and 150° or between 45° and 135°. Thus, in these embodiments, the teeth are inclined either forwards or backwards with respect to the direction of propagation of the optical signal.

The teeth 40 may take other forms. In particular, it is not necessary for the horizontal cross section of these teeth to be rectangular. For example, the horizontal cross section of the tooth 40 may also be triangular, square, circular or another shape. The tooth 40 may also have a horizontal cross section that is identical to that shown in the following articles:

A. Brimont et al., "High speed silicon electro-optical modulators enhanced via slow light propagation", Optics Express 20876, 14/14/2011, Vol 19, No. 21;

Shayan Mookherjea et al., "Localisation in silicon nanophotonic slow—light waveguides", Nature Photonics, Vol 2, February 2008.

The length $L_{40}$ may be greater than $2\lambda$. However, in this case, the part of the tooth 40 that extends beyond $2\lambda$ has very little effect on the operation of the slow light waveguide. Consequently, when the length $L_{40}$ is greater than $2\lambda$, the teeth 40 may be of any length as long as it remains greater than $2\lambda$. In particular, in this case, it is not necessary for all of the teeth 40 of the guide 26 to be of the same length. Likewise, in this case, the teeth 40 the lengths of which are greater than $2\lambda$ do not need to be symmetrical with respect to the plane $P_L$.

The width of the strip 32 of the guide 26 is not necessarily constant. For example, this width may vary gradually to reach a minimum located equidistantly from the two inputs.

As a variant, the same slow light waveguide is used to slow multiple optical signals having different wavelengths simultaneously. For example, in this case, each different wavelength corresponds to a respective operating point of the slow light waveguide.

Silicon Waveguide Variant:

The silicon waveguide may be replaced by a multimode silicon waveguide.

In another embodiment, the silicon strip 28 is separated from the silicon plate by a thin layer of another material such as, for example, a layer of silicon oxide. In another variant, the strip 28 is produced in a material other than the material of the plate 14, as described in U.S. Pat. No. 8,761,220. For example, the strip is made of polycrystalline silicon.

In another variant, the waveguide 24 is omitted such that the photodiode includes just one input.

As a variant, the transition zone between the guides 22 and 26 is omitted. For example, the cross section of the guide 22 is constant from the input 6 up to the output 30.

In another embodiment, the guides 22 and 24 are different. For example, they are shaped so as to guide different optical signals.

Other Variants:

The silicon oxide used to encapsulate the guide 26 and guides 22 and 24 may be replaced by another material, such as silicon nitride.

Figure 8:
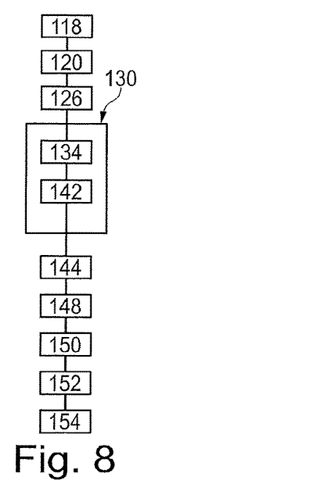
FIG. 8 is a flowchart of a method for manufacturing the photodiode of FIG. 1.

Lastly, the photodiodes described above, and in particular the photodiodes with two facing inputs, may also be manufactured using methods other than the method of FIG. 8. For example, as a variant, the layer 128 is omitted in the manufacturing process. In this case, in the germanium growth step, the germanium layer grows not only inside the cavity 60 but also over the entirety of the face 20 of the silicon plate 14. Next, a polishing step, for example chemical-mechanical polishing (CMP) is implemented in order to remove the thickness of germanium present on the upper face 60 of the plate 14 without however removing the thickness of germanium housed within the cavity. By proceeding in this manner, a slow light waveguide identical to the guide 26 is obtained except that the thickness $e_{26}$ of this guide is equal to the depth $P_{60}$ of the cavity 60. The other steps of manufacturing the photodiode are, for example, identical to those described above.

Another possible method for fabricating the photodiodes described consists in replacing the protective layer 128 by a stop layer which is identical but made of a material on which germanium is able to grow by epitaxy in step (150). Next, the germanium layer which has grown on this stop layer is removed by polishing, for example by CMP polishing, using this stop layer as a stop layer against this polishing. Next, the stop layer is itself optionally removed.

The invention claimed is:

1. A photodiode including:
   a silicon plate extending mainly in a plane referred to as the "plane of the plate";
   a first waveguide including a strip that is capable of guiding an optical signal from an input, intended to receive an optical signal to be detected, to an output, this strip being formed on the plate;
   a germanium slow light waveguide extending along an optical axis from a first input that is optically coupled to the output of the first waveguide, this slow light waveguide including:
      two doped regions with opposite signs, positioned on either side of the optical axis so as to capture the charge carriers generated by the optical signal propagating through this slow light waveguide; and
      a horizontal cross section, parallel to the plane of the plate, that exhibits patterns positioned symmetrically on either side of the optical axis and repeated at regular intervals p along this optical axis so as to slow the propagation of the optical signal through the slow light waveguide, this pattern including two lateral teeth each positioned on a respective side of a germanium central strip or a silicon cylindrical pad that passes from one side of the germanium central strip to the other,
   wherein:
   the photodiode includes a cavity hollowed out of the silicon plate, the bottom of which is located inside the silicon plate and the cross section of which, parallel to the plane of the plate, is identical to the horizontal cross section of the slow light waveguide; and
   the slow light waveguide completely fills this cavity and extends, in a direction perpendicular to the plane of the plate, from the bottom of this cavity up to an upper face located at the same level as or above the upper face of the plate.

2. Photodiode according to claim 1, in which the photodiode also includes:
   a second waveguide including a strip that is capable of guiding an optical signal from another input, intended to receive another optical signal to be detected, to another output, this strip being formed on the plate; and
   the slow light waveguide includes, along the optical axis and on the opposite side to the first input, a second input that is optically coupled to the output of the second waveguide.

3. Photodiode according to claim 1, in which:
   the slow light waveguide includes a central strip that extends along the optical axis in order to guide the optical signal along this optical axis; and
   the pattern includes the two lateral teeth each positioned on a respective side of the central strip and symmetrical to one another with respect to a longitudinal plane, this longitudinal plane being perpendicular to the plane of the plate and containing the optical axis, the length of each of these teeth being greater than or equal to the width of the central strip, the length of a tooth being equal to the shortest distance between its distal end and the longitudinal plane and the width of the central strip being equal to the shortest distance between two vertical flanks facing this central strip, each located on a respective side of the optical axis and between two successive teeth.

4. Photodiode according to claim 3, in which the length of more than a third of the teeth is twice greater than or equal to the width of the central strip.

5. Photodiode according to claim 1, in which the plate includes doped regions of opposite signs in direct contact with the slow light waveguide, these doped regions of the plate including doped vertical edges of the cavity in direct mechanical and electrical contact with vertical flanks of the slow light waveguide.

6. Photodiode according to claim 1, in which the output of the first waveguide is facing and in direct mechanical contact with the first input of the slow light waveguide.

7. Photodiode according to claim 1, in which the thickness of the slow light waveguide is equal to the depth of the cavity.

8. Photodiode according to claim 1, in which the silicon plate extends directly over a dielectric layer, itself directly deposited on a substrate.

\* \* \* \* \*